(12) United States Patent
Shinozaki

(10) Patent No.: US 6,256,240 B1
(45) Date of Patent: Jul. 3, 2001

(54) SEMICONDUCTOR MEMORY CIRCUIT

(75) Inventor: Naoharu Shinozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/385,006

(22) Filed: Aug. 27, 1999

(30) Foreign Application Priority Data

Nov. 9, 1998 (JP) .................................................. 10-317977

(51) Int. Cl.$^7$ .............................. G11C 7/00; G11C 29/00
(52) U.S. Cl. ......................... 365/201; 365/233; 365/239
(58) Field of Search .................................... 365/201, 233, 365/239, 230.08

(56) References Cited

U.S. PATENT DOCUMENTS 4,992,985 * 2/1991 Miyazawa et al. ................... 365/201
5,825,782 * 10/1998 Roohparvar ...................... 365/201 X

* cited by examiner

Primary Examiner—Huan Hoang
(74) Attorney, Agent, or Firm—Arent Fox Kintner Plotkin & Kahn, PLLC

(57) ABSTRACT

A semiconductor memory circuit includes a circuit which generates a test mode entry signal which enables a test mode directed to evaluating the semiconductor memory circuit. The circuit generates the test mode entry signal on the basis of a plurality of combinations of a predetermined command signal sequentially applied from an outside of the semiconductor memory circuit.

12 Claims, 6 Drawing Sheets

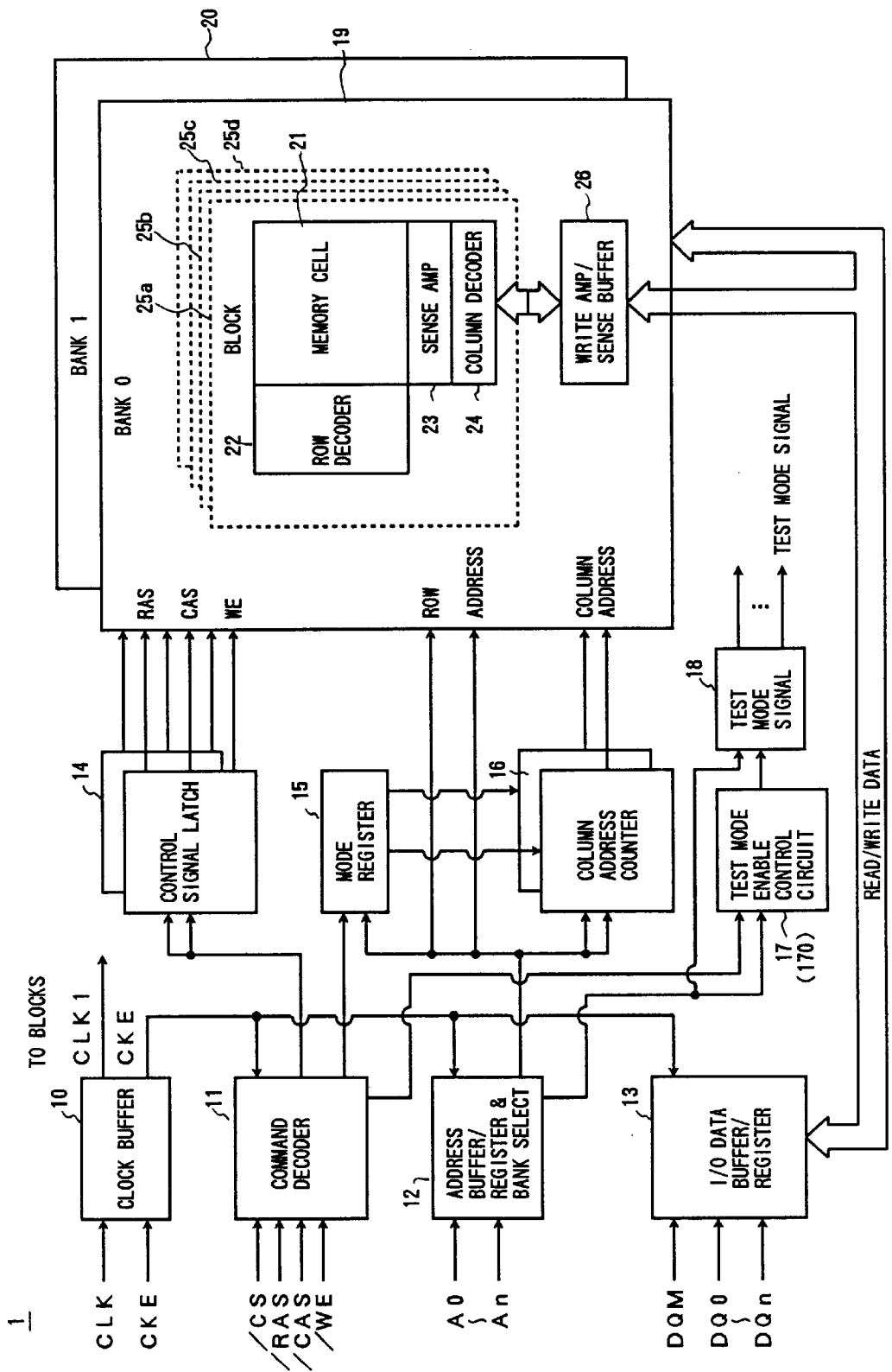
F I G. 1

FIG. 4

| FIELD | FUNCTION NAME | A11 | A10 | A9 | A8 | A7 | A6 | A5 | A4 | A3 | A2 | A1 | A0 | FUNCTION |
|---|---|---|---|---|---|---|---|---|---|---|---|---|---|---|
| 0~2 : BL | BURST LENGTH |  |  |  |  |  |  |  |  |  | 0 | 0 | 0 | BL = 1 * |
|  |  |  |  |  |  |  |  |  |  |  | 0 | 0 | 1 | BL = 2 |
|  |  |  |  |  |  |  |  |  |  |  | 0 | 1 | 0 | BL = 4 |
|  |  |  |  |  |  |  |  |  |  |  | 0 | 1 | 1 | BL = 8 |
|  |  |  |  |  |  |  |  |  |  |  | 1 | 0 | 0 | NOT YET USED |
|  |  |  |  |  |  |  |  |  |  |  | 1 | 0 | 1 |  |
|  |  |  |  |  |  |  |  |  |  |  | 1 | 1 | 0 |  |
|  |  |  |  |  |  |  |  |  |  |  | 1 | 1 | 1 |  |
| 3 : BT | BURST TYPE |  |  |  |  |  |  |  |  | 0 |  |  |  | SEQUENTIAL MODE |
|  |  |  |  |  |  |  |  |  |  | 1 |  |  |  | INTERLEAVE MODE |
| 4~6 : CL | CAS LATENCY |  |  |  |  |  | 0 | 0 | 0 |  |  |  |  | NOT YET USED |
|  |  |  |  |  |  |  | 0 | 0 | 1 |  |  |  |  | CL = 1 |
|  |  |  |  |  |  |  | 0 | 1 | 0 |  |  |  |  | CL = 2 |
|  |  |  |  |  |  |  | 0 | 1 | 1 |  |  |  |  | CL = 3 |
|  |  |  |  |  |  |  | 1 | 0 | 0 |  |  |  |  | NOT YET USED |
|  |  |  |  |  |  |  | 1 | 0 | 1 |  |  |  |  |  |
|  |  |  |  |  |  |  | 1 | 1 | 0 |  |  |  |  |  |
|  |  |  |  |  |  |  | 1 | 1 | 1 |  |  |  |  |  |
| 7~11 |  | 0 | 0 | 0 | 0 | 0 |  |  |  |  |  |  |  | SET TO 0 |

* : NOT APPLIED IN INTERLEAVE MODE

SEMICONDUCTOR MEMORY CIRCUIT

BACKGROUND OF THE INVENTION

FIELD OF THE INVENTION

The present invention generally relates to semiconductor memory circuits, and more particularly to a semiconductor memory circuit having a test mode enabled in response to a command.

Recently, the speedup of CPUs has required semiconductor devices such as DRAMs (Dynamic Random Access Memories) to input and output data at a higher signal frequency and increase the data transfer rate. As semiconductor memory circuits capable of satisfying such a requirement, there are known a synchronous dynamic random access memory (SDRAM) and a fast cycle random access memory (FCRAM), which memories operate in synchronism with a clock signal supplied from the outside of the circuits.

Generally, semiconductor devices which operate at a high speed are equipped with a test mode directed to determining whether the semiconductor devices operate normally. The semiconductor devices can shift to the test mode from a normal mode by a given combination of signals supplied from the outside. Hereinafter, the shift from the normal mode to the test mode will be referred to as a test mode entry.

A description will now be given of the test mode entry in a synchronous DRAM (SDRAM).

FIG. 1 is a block diagram of an SDRAM 1, which includes a block buffer 10, a command decoder 11, an address buffer/register&bank select circuit 12, an I/O data buffer/register 13, control signal latch circuits 14, a mode register 15, column address counters 16, a test mode enable control circuit 17, a test mode decoder 18, a bank-0 circuit 19 and a bank-1 circuit 20.

Each of the bank-0 circuit 19 and the bank-0 circuit 20 includes a plurality of memory cell blocks 25a, 25b, 25c and 25d, and a write amplifier/sense buffer 26. Each of the memory cell blocks 25a–25d includes memory cells 21 arranged in a matrix formation, a row decoder 22, and a sense amplifier block 23.

The cell matrix (which is also referred to as a core circuit) having the memory cells arranged in the matrix formation is divided into parts on the bank basis. Each of the bank-based divided cell matrixes is divided into blocks 25a–25d. In each of the blocks 25a–25d, the memory cells are arranged in rows and columns. Each of the blocks 25a–25d is equipped with the sense amplifier block 23. Although the SDRAM 1 shown in FIG. 1 has two banks, an arbitrary number of banks can be defined in the SDRAM 1.

A description will be given of the functions of the structural parts which form the SDRAM 1. The clock buffer 10 receives a clock signal CLK and a clock enable signal CKE from the outside, and supplies an internal synchronous clock signal CLK1 based on the clock enable signal CKE to the structural parts. The clock enable signal CKE is supplied to the command decoder 11, the address buffer/register&bank select circuit 12, and the I/O data buffer/register 13.

The command decoder 11 is externally supplied with a chip select signal/CS, a row address strobe signal/RAS, a column address strobe signal/CAS, and a write enable signal/WE. The command is defined by the combination of the above-mentioned control signals. A decoded command is then supplied to the control signal latch circuit 14, the mode register 15 and the test mode enable control circuit 17. The control signal latch circuit 14 latches the decoded command supplied from the command decoder 11, and supplies it to the bank-0 circuit 19 and the bank-1 circuit 20. The symbol "/" denotes the active-low logic.

The address buffer/register&bank select circuit 12 is supplied with a memory address signal consisting of address bits A0–An from the outside. Then, the memory address signal of bits A0–An is supplied to the mode register 15, the column address counter 16, and the test mode enable control circuit 17. The most significant bit An of the memory address signal is used as a bank select signal and selects either the bank-0 circuit 19 or the bank-1 circuit 20.

The I/O data buffer/register 13 receives data signals DQ0–DQn and a data input/output mask signal DQM from the outside. The data signals DQO–DQn received from the outside are supplied to the bank-0 circuit 19 and the bank-1 circuit 20. Also, the I/O data buffer/register 13 receives data signals DQO–DQn from the bank-0 circuit 19 and the bank-1 circuit 20. The data input/output mask signal DQM masks the input/output data signals DQO–DQn as necessary.

The mode register 15 is equipped with a register which stores data indicating the burst length in the data read/write operation. The data indicating the burst length is described by the decoded command and the memory address signal and is set in the mode register 15. The above data is supplied to the column address counters 16 as burst length information. The column address counters 16 generate column address signals from the memory address signal supplied from the address buffer/register&bank select circuit 12, and output the column address signals to the bank-0 circuit 19 and the bank-1 circuit 20.

The test mode enable control circuit 17 determines whether the test mode entry should be permitted on the basis of the combination of a mode register set command MRS and the memory address signal. The mode register set command MRS is a command defined by the row address strobe signal/RAS, the column address strobe signal/CAS and the write enable signal/WE. When the test mode entry is permitted, the test mode enable control signal 17 supplies a test mode entry to the test mode decoder 18.

The test mode decoder 18 generates test mode signals indicative of respective test modes on the basis of the combination of the test mode entry signal and the memory address signal. The test mode signals are then supplied to the structural parts related to the respective test modes.

A description will now be given of the structure of the bank-0 circuit 19 and the functions thereof. The structure of the bank-1 circuit 20 and the functions thereof are the same as those of the bank-0 circuit 19.

In the bank-0 circuit 19, data stored in the memory cells 21 of the blocks 25a, 25b, 25c and 25d are supplied to the sense amplifier block 23. For example, in the block 25a, the row decoder 22 generates a word line select signal for selecting the word line specified by the memory address signal A0–An. The sense amplifier block 23 receives and holds data stored in the memory cells 21 connected to the selected word line. The column decoder 24 generates column line select signals for simultaneously selecting a plurality of bits of the data stored in the sense amplifier block 23, which has sense amplifiers provided to the respective bit lines.

At the time of reading data, the write amplifier/sense buffer 26 receives parallel data read from the selected block and outputs the parallel data to a write data bus. At the time of writing data, the write amplifier/sense buffer 26 buffers the received parallel data and outputs the buffered parallel data to a global data bus, which is coupled to the bit line via a column gate provided in the block of the column decoder 24 and controlled thereby.

A description will be given of a structure of the test mode enable control circuit 17 and the functions thereof by referring to FIG. 2. As shown in FIG. 2, the circuit 17 is made up of NAND circuits 100, 110, 120, 130 and 150, and NOT circuits 140 and 160.

The NAND circuit 100 receives the memory address signal A7 from the address buffer/register&bank select circuit 12 and the mode register set command MRS from the command decoder 11, and outputs a resultant signal to the NAND circuit 130. The NAND circuit 110 receives the memory address signal A8 from the address buffer/register&bank select circuit 12 and a reset command signal from the command decoder 11, and outputs a resultant signal to the NAND circuit 120.

The NAND circuit 120 receives the output signal of the NAND circuit 110 and a power-on signal, and outputs a resultant signal to the NAND circuit 150 via the NOT circuit 140. The NAND circuit 130 receives the output signals of the NAND circuits 100 and 150, and outputs a resultant signal to the NAND circuit 150. The NAND circuit 150 receives the signal from the NOT circuit 140 and the output signal of the NAND circuit 130, and supplies the test mode entry signal to the test mode decoder 18 via the NOT circuit 160.

The NAND circuits 130 and 150 and the NOT circuits 140 and 160 form a latch circuit 17, which supplies the test mode entry signal to the test decoder 18 at the time of the test mode. Also, the latch circuit 170 stops outputting the test mode entry signal on the basis of the memory address signal A8, the reset command signal and the power-on signal.

As described above, the test mode enable control circuit 170 controls the outputting of the test mode entry signal on the basis of the memory address signals A7 and A8 from the address buffer/register&bank select circuit 12, the mode register set command MRS and the reset command signal from the command decoder 11, and the power-on signal.

However, there is a possibility that the test mode entry signal may accidentally be generated because the test mode entry signal is based on the mode register set command MRS which is defined by the combination of the chip select signal/CS, the row address strobe signal/RAS, the column address strobe signal/CAS and the write enable signal/WE. The above possibility is high particularly at the time of power on because the signals are not yet settled.

SUMMARY OF THE INVENTION

It is a general object of the present invention to provide a semiconductor memory circuit in which the above disadvantage is eliminated.

A more specific object of the present invention is to provide a semiconductor memory circuit having the function of preventing the semiconductor memory circuit from accidentally changing to the test mode from the normal mode.

The above objects of the present invention are achieved by a semiconductor memory circuit including a first circuit which generates a test mode entry signal which enables a test mode directed to evaluating the semiconductor memory circuit; the first circuit generating the test mode entry signal on the basis of a plurality of combinations of a predetermined command signal sequentially applied from an outside of the semiconductor memory circuit.

BRIEF DESCRIPTION OF THE DRAWINGS

Other objects, features and advantages of the present invention will become more apparent from the following detailed description when read in conjunction with the accompanying drawings, in which:

FIG. 1 is a block diagram of an entire structure of a semiconductor memory circuit;

FIG. 4 is a diagram showing an example of setting of operation modes defined by a mode register set command;

DESCRIPTION OF THE PREFERRED EMBODIMENTS

Figure 2:
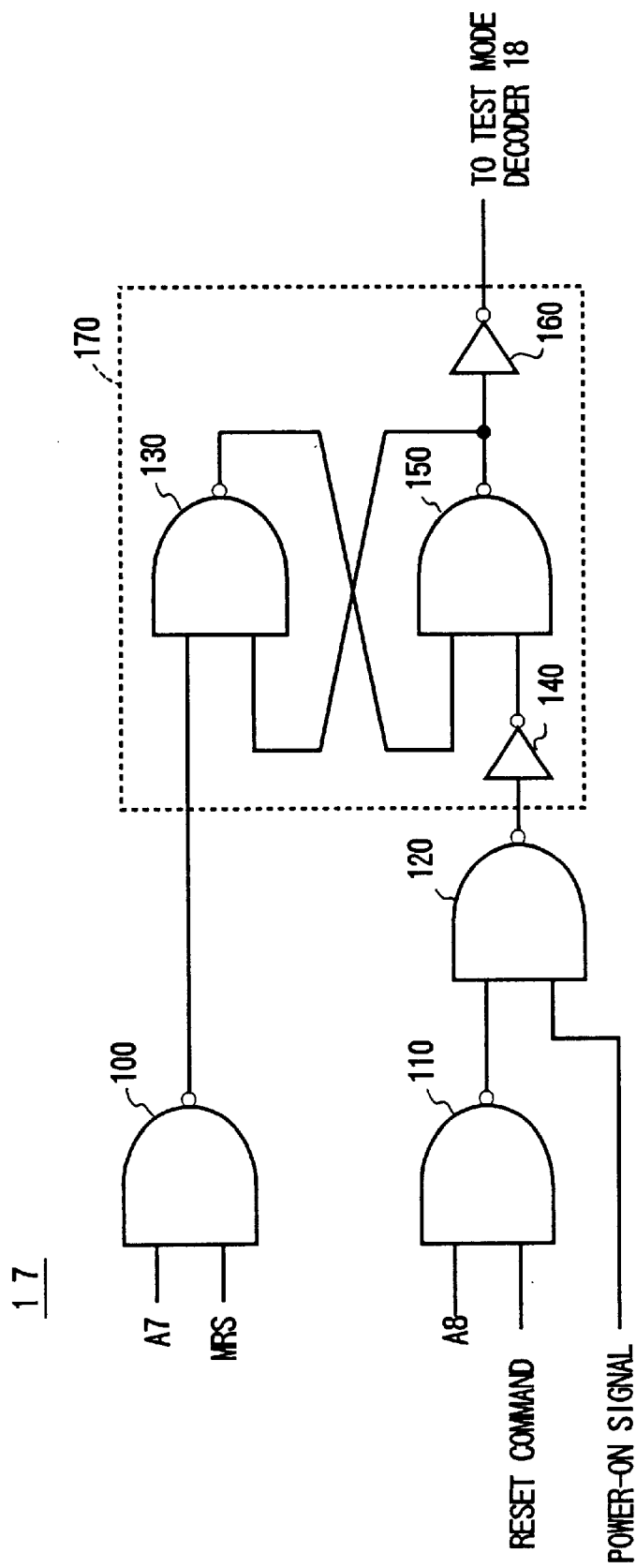
FIG. 2 is a circuit diagram of a conventional test mode enable control circuit shown in FIG. 1.

A description will now be given of a semiconductor memory circuit according to an embodiment of the present invention, which has the same block configuration as shown in FIG. 1. However, a test mode enable control circuit employed in the embodiment of the present invention (now assigned a reference number 170) has a structure different from that of the test mode enable control circuit 17 shown in FIG. 2. Thus, the following description is mainly directed to the structure and functions of the test mode enable control circuit 170 employed in the present embodiment, and the structural parts which have been described with reference to FIG. 1 will not be described hereinafter.

Figure 3:
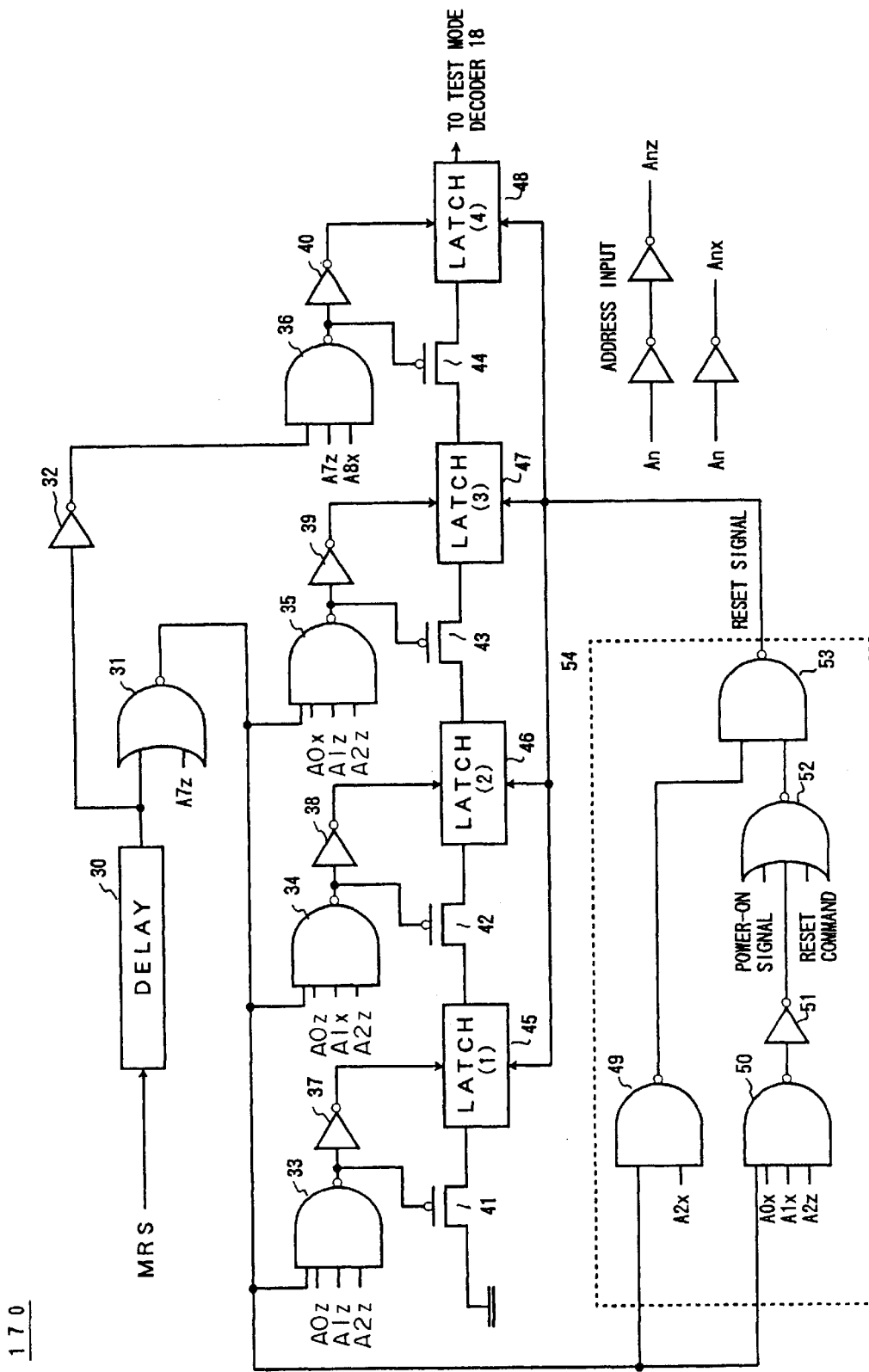
FIG. 3 is a circuit diagram of a test mode enable control circuit employed in a semiconductor memory circuit according to an embodiment of the present invention.

The test mode enable control circuit 170 includes a delay circuit 30, a NOR circuit 31, NOT circuits 32, 37–40, NAND circuits 33–36, PMOS (P-channel MOS) transistors 41–44, latch circuits 45–48, and a reset circuit 54. The reset circuit 54 is made up of NAND circuits 49, 50 and 53, a NOT circuit 51, and a NOR circuit 52. In FIG. 3, a memory address signal Anz denotes a signal obtained by passing an address signal An through two NOT circuits, and a memory address signal Anx denotes a signal obtained by passing the address signal An through one NOT circuit.

The delay circuit 30 receives the mode register set command MRS from the command decoder 11, and outputs it to the NOR circuit 31 at an appropriate timing. Further, the delayed mode register set command MRS is supplied to the NAND circuit 36 via the NOT circuit 32.

The NOR circuit 31 is supplied with the mode register set command MRS from the delay circuit 30 and a memory address signal A7z. The output signal of the NOR circuit 31 is then sent to the NAND circuits 33–35, 49 and 50. As shown in FIG. 3, the NAND circuits 33–36 are supplied with the respective combinations of the memory address signals, which are mutually different from each other. The NAND circuits 33–36 are connected in series via the latch circuits 45–48. The latch circuits 45–48 are coupled via the PMOS transistors 41–44, as shown in FIG. 3.

The combinations of the memory address signals respectively applied to the NAND circuits 33–36 are those other than the combinations of the memory address signals used for other applications such as the setting of operation modes defined by the mode register set command MRS, for instance, the setting of the burst length and a CAS latency.

FIG. 4 shows an example of the operation modes defined by the mode register set command MRS. For example, the combination of A0=1, A1=1 and A2=1 supplied to the NAND circuit 33 is not used for the mode register set command MRS. Similarly, the combinations of the memory address signals supplied to the NAND circuits 34–36 are not used for the mode register set command MRS. Hereinafter, the combinations of the unused memory address signals will be referred to as illegal patterns.

When the NAND circuit 33 is supplied with the output signal of the NOR circuit 31 and an illegal pattern (A0z, A1z, A2z), the NAND circuit 33 outputs a resultant signal to the latch circuit 45 via the NOT circuit 37, and turns ON the PMOS transistor 41. Thus, the latch circuit 45 latches a high-level signal.

When the NAND circuit 34 is supplied with the output signal of the NOR circuit 31 and an illegal pattern (A0z, A1x, A2z), the NAND circuit 34 outputs a resultant signal to the latch circuit 46 via the NOT circuit 38, and turns ON the PMOS transistor 42. Thus, the high-level signal that is output from the latch circuit 45 is latched in the latch circuit 46.

When the NAND circuit 35 is supplied with the output signal of the NOR circuit 31 and an illegal pattern (A0x, A1z, A2z), the NAND circuit 35 outputs a resultant signal to the latch circuit 47 via the NOR circuit 39, and turns ON the PMOS transistor 43. Thus, the high-level signal output from the latch circuit 46 is latched in the latch circuit 47.

When the NAND circuit 36 is supplied with the output signal of the NOT circuit 32 and an illegal pattern (A7z, A8x), the NAND circuit 36 supplies a resultant signal to the latch circuit 48 via the NOT circuit 40, and turns ON the PMOS transistor 44. Thus, the high-level signal output from the latch circuit 47 is latched in the latch circuit 48. The high-level signal output from the latch circuit 48 is supplied to the test mode decoder 18 as the test mode entry signal.

The above operation relates to the case where the four illegal patterns are duly supplied to the NAND circuits 33–36, respectively. However, if at least one of the four illegal patterns is not duly supplied, the corresponding one of the PMOS transistors 41–44 is not turned ON. Hence, the high-level signal is not supplied to the latch circuit 48. Thus, the test mode entry signal is not supplied to the test mode decoder 18.

Also, if the reset circuit 54 is supplied with the power-on signal, the reset command signal or an illegal pattern which is not used in the NAND circuits 33–36, the reset circuit 54 outputs the reset signal which resets the latch circuits 45–48. The reset command signal is a signal supplied to the reset circuit 54 by inputting a command other than the mode register set command MRS, such as a command indicative of a device disable select or no operation.

The reset circuit 54 will now be described. When the NAND circuit 49 of the reset circuit 54 receives the output signal of the NOR circuit 31 and an illegal pattern (A2x), the NAND circuit 49 outputs a resultant signal to the NAND circuit 53. When the NAND circuit 50 receives the output signal of the NOR circuit 31 and an illegal pattern (A0x, A1x, A2z), the NAND circuit 50 outputs a resultant signal to the NOR circuit 52 via the NOT circuit 51. The NOR circuit 52 is supplied with the power-on signal, the reset command signal and the output signal of the NOT circuit 51. When the NOR circuit 52 receives one of the above three signals, the NOR circuit 52 outputs the signal to the NAND circuit 53.

The NAND circuit 53 is supplied with the output signals of the NAND circuit 49 and the NOR circuit 52. If the power-on signal, the reset command or an illegal pattern not used in the NAND circuits 33–36 is supplied to the reset circuit 54, the NAND circuit 53 outputs the reset signal to the latch circuits 45–48.

Figure 5:
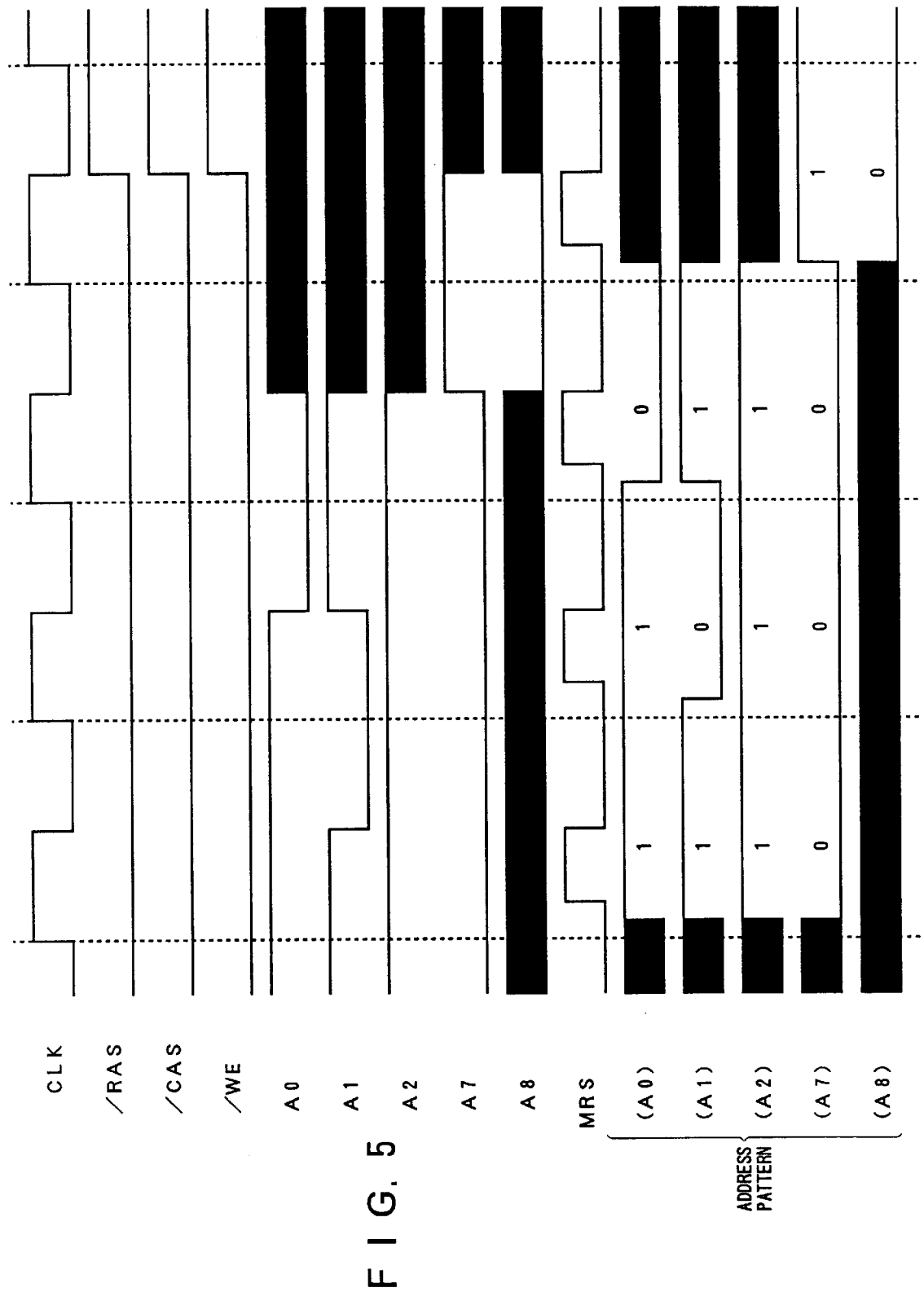
FIG. 5 is a timing chart of an example of a test mode entry operation.

FIG. 5 is a timing chart of an example of the test mode entry operation of the semiconductor memory circuit 1. A description will now be given, with reference to FIGS. 1, 3 and 5, of a timing control of the test mode entry operation. The timing chart of FIG. 5 shows a case where the illegal patterns are duly supplied to the test mode enable control circuit 170 and the test mode entry signal is duly generated.

When the clock signal CLK rises for the first time, the memory address signals A0–A2 and A7 are supplied to the NAND circuit 33 in synchronism with the rising edge of the mode register set command MRS. At that time, the memory address signals A0–A2 are the same as the illegal pattern of the NAND circuit 33. Hence, the latch circuit 45 latches the high-level signal. At that time, the row address strobe signal/RAS, the column address strobe signal/CAS and the write enable signal/WE supplied to the command decoder 8 are all at the low level.

When the clock signal CLK rises for the second time, the memory address signals A0–A2 and A7 are supplied to the NAND circuit 34 in synchronism with the rising edge of the mode register set command MRS. At that time, the memory address signals A0–A2 are the same as the illegal pattern of the NAND circuit 34. Hence, the latch circuit 46 latches the high-level signal. At that time, the row address strobe signal/RAS, the column address strobe signal/CAS and the write enable signal/WE supplied to the command decoder 8 are all at the low level.

When the clock signal CLK rises again, the memory address signals A0–A2 and A7 are supplied to the NAND circuit 35 in synchronism with the rising edge of the mode register set command MRS. At that time, the memory address signals A0–A2 are the same as the illegal pattern of the NAND circuit 35. Hence, the latch circuit 47 latches the high-level signal.

When the clock signal CLK rises again, the memory address signals A7 and A8 are supplied to the NAND circuit 36 in synchronism with the rising edge of the mode register set command MRS. At that time, the memory address signals A7 and A8 are the same as the illegal pattern of the NAND circuit 36. Thus, the latch circuit 48 latches the high-level signal. Further, as shown in FIG. 5, the row address strobe signal/RAS, the column address strobe signal/CAS and the write enable signal/WE changes to the high level.

As described above, the illegal patterns are sequentially checked in order to determine whether the illegal patterns are duly supplied. When all of the illegal patterns are confirmed, the test mode entry signal is duly supplied from the test mode enable control circuit 170 to the test mode decoder 18.

Figure 6:
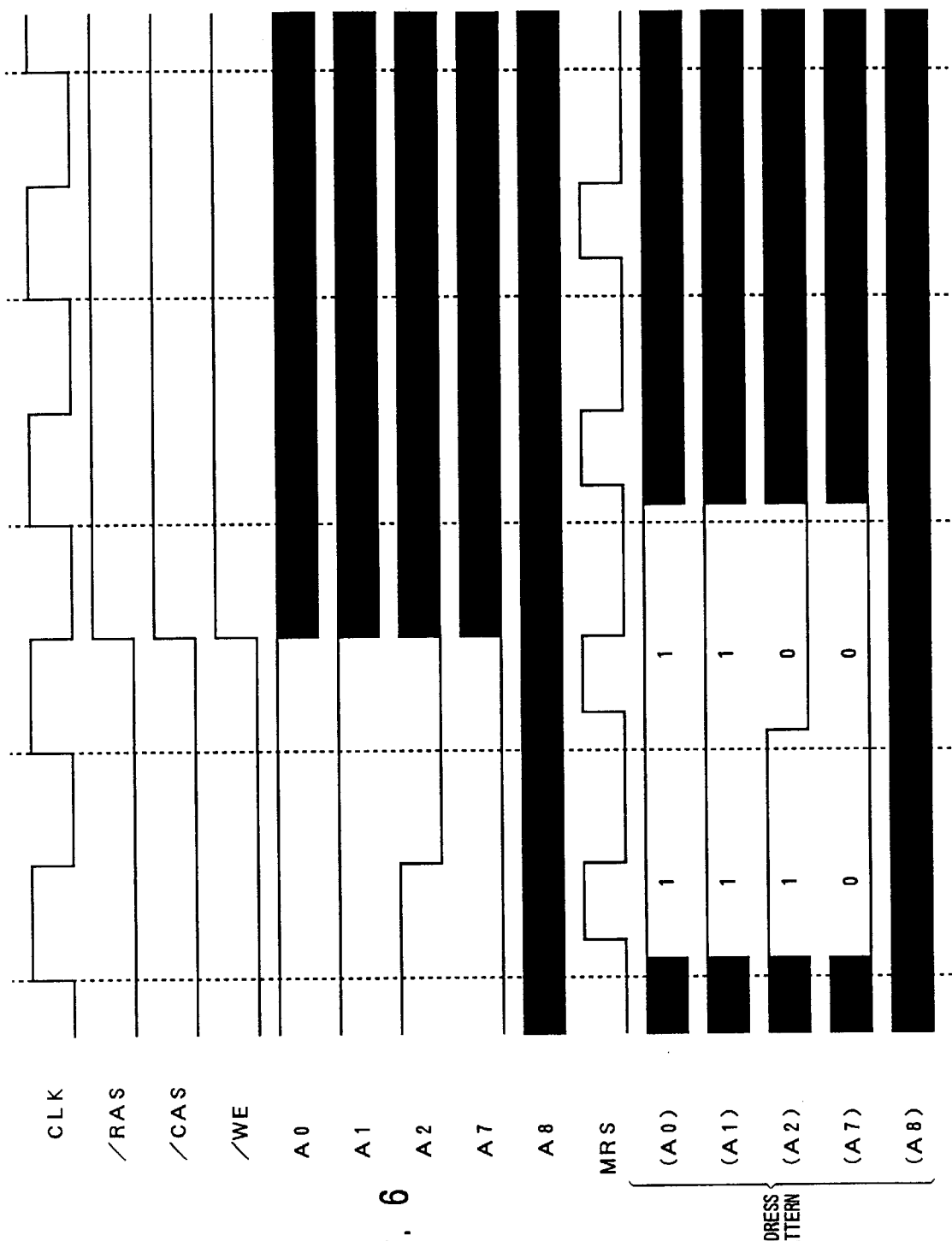
FIG. 6 is a timing chart of another example of the test mode entry operation.

FIG. 6 is a timing chart of another example of the test mode entry signal in which the illegal patterns are not duly supplied to the test mode enable control circuit 170, which does not result in the test mode entry signal.

When the clock signal CLK rises for the first time, the memory address signals A0–A2 and A7 are supplied to the NAND circuit 33 in synchronism with the rising edge of the mode register set command MRS. At that time, the memory address signals A0–A2 are the same as the illegal pattern of the NAND circuit 33. Hence, the latch circuit 45 latches the high-level signal. At that time, the row address strobe signal/RAS, the column address strobe signal/CAS and the write enable signal/WE supplied to the command decoder 8 are all at the low level.

When the clock signal CLK rises again, the memory address signals A0–A2 and A7 are supplied to the NAND circuit 34 in synchronism with the rising edge of the mode register set command MRS. At that time, the memory address signals A0–A2 differ from the illegal pattern of the NAND circuit 34. Hence, the PMOS transistor is not turned ON, and the high-level signal from the latch circuit 45 is not latched in the latch circuit 46. Further, the memory address signal A2 is low and the high-level signal is sent to the NAND circuit 53 from the NAND circuit 49. Further, the reset signal is output to the latch circuits 45–48 from the NAND circuit 53. Furthermore, the row address strobe signal/RAS, the column address strobe signal/CAS and the write enable signal/WE change to the high level. Thus, if an erroneous illegal pattern is supplied to the test mode enable control circuit 170, the high-level signal is not supplied to the latch circuit 48, and the test mode entry signal is not supplied to the test mode decoder 18.

As described above, a plurality of illegal patterns are used to generate the test mode entry signal.

Further, the reset process can reliably be carried out by using the illegal pattern which is not utilized for the output control of the test mode entry signal. Thus, it is possible to drastically reduce the probability in which the memory circuit happens to shift to the test mode from the normal mode.

The NAND circuits 33–36, the NOT circuits 37–40, and the latch circuits 45–48 form a decision part.

The present invention is not limited to the specifically disclosed embodiments, and variations and modifications may be made without departing from the scope of the present invention.

What is claimed is:

1. A semiconductor memory circuit comprising:
   a first circuit which generates a test mode entry signal which enables a test mode directed to evaluating the semiconductor memory circuit;
   the first circuit generates the test mode entry signal on the basis of a plurality of combinations of predetermined command signals sequentially applied from an outside of the semiconductor memory circuit.

2. The semiconductor memory circuit as claimed in claim 1, wherein the first circuit comprises a decision part which determines whether all of the plurality of combinations coincide with predetermined combinations.

3. The semiconductor memory circuit as claimed in claim 1, wherein the first circuit comprises a decision part which has predetermined combinations related to the plurality of combinations externally supplied and sequentially determines whether each of the plurality of combinations, coincides with a corresponding one of the predetermined combinations.

4. The semiconductor memory circuit as claimed in claim 1, wherein the first circuit comprises a decision part which determines whether all of the plurality of combinations coincide with predetermined combinations, and generates a test mode entry signal when it is determined that all of the plurality of combinations coincide with the predetermined combinations.

5. The semiconductor memory circuit as claimed in claim 1, wherein the plurality of combinations are those not used for other applications in the semiconductor memory circuit.

6. The semiconductor memory circuit as claimed in claim 1, wherein the first circuit comprises a circuit which ends the test mode when a combination which is different from any of predetermined combinations is received.

7. The semiconductor memory circuit as claimed in claim 1, further comprising a reset circuit which resets the first circuit when the reset circuit receives a combination of an address signal and the predetermined command signals which are different from any of predetermined combinations.

8. The semiconductor memory circuit as claimed in claim 1, wherein the plurality of combinations include combinations of the predetermined command signals and predetermined bits of an address signal.

9. The semiconductor memory circuit as claimed in claim 1, further comprising a command decoder which decodes commands including the predetermined command signals, the commands being defined by given signals supplied from the outside.

10. The semiconductor memory circuit as claimed in claim 1, wherein the semiconductor memory circuit operates in synchronism with a clock signal supplied from the outside.

11. The semiconductor memory circuit as claimed in claim 1, wherein:
    the first circuit comprises a plurality of logic circuits coupled in series via respective latch circuits;
    the plurality of logic circuits receive the respective plurality of combinations of an address signal and the predetermined command signals; and
    output signals of the plurality of logic circuits are respectively written into the latch circuits.

12. The semiconductor memory circuit as claimed in claim 11, further comprising a reset circuit which resets the latch circuits when the reset circuit receives a combination of the address signal and the predetermine command signals which are different from any of the respective combinations.

* * * * *